(12) United States Patent
Diazzi et al.

(10) Patent No.: US 12,098,921 B2
(45) Date of Patent: Sep. 24, 2024

(54) PHASE-LOCKED LOOP FOR A DRIVER CIRCUIT FOR OPERATING A MEMS GYROSCOPE

(71) Applicant: Robert Bosch GmbH, Stuttgart (DE)

(72) Inventors: Francesco Diazzi, Munich (DE); Andrea Visconti, Munich (DE)

(73) Assignee: ROBERT BOSCH GMBH, Stuttgart (DE)

( * ) Notice: Subject to any disclaimer, the term of this patent is extended or adjusted under 35 U.S.C. 154(b) by 292 days.

(21) Appl. No.: 17/778,951

(22) PCT Filed: Nov. 10, 2020

(86) PCT No.: PCT/EP2020/081572
§ 371 (c)(1),
(2) Date: May 23, 2022

(87) PCT Pub. No.: WO2021/115701
PCT Pub. Date: Jun. 17, 2021

(65) Prior Publication Data
US 2023/0003525 A1  Jan. 5, 2023

(30) Foreign Application Priority Data
Dec. 13, 2019 (DE) ..................... 10 2019 219 630.6

(51) Int. Cl.
*G01C 19/5776* (2012.01)
*G01C 19/567* (2012.01)
*H03L 7/099* (2006.01)

(52) U.S. Cl.
CPC ....... *G01C 19/5776* (2013.01); *G01C 19/567* (2013.01); *H03L 7/099* (2013.01)

(58) Field of Classification Search
CPC .. G01C 19/56; G01C 19/567; G01C 19/5705; G01C 19/5712; G01C 19/5719;
(Continued)

(56) References Cited

U.S. PATENT DOCUMENTS 6,506,757 B1  1/2003  Tajima et al.
9,506,757 B2  11/2016  Shaeffer et al.
(Continued)

FOREIGN PATENT DOCUMENTS

DE  10238029 A1  3/2004

OTHER PUBLICATIONS

International Search Report for PCT/EP2020/081572, Issued Feb. 9, 2021.

*Primary Examiner* — Benjamin R Schmitt
(74) *Attorney, Agent, or Firm* — NORTON ROSE FULBRIGHT US LLP; Gerard A. Messina

(57) ABSTRACT

A phase-locked loop for a driver circuit for operating a MEMS gyroscope, including a seismic mass that is excitable into oscillations. The phase-locked loop including an input interface for receiving position signals that represent the present position of the oscillating seismic mass of the MEMS gyroscope, a phase detector for ascertaining the phase and frequency of the present oscillation movement of the seismic mass, based on the received position signals, at least two oscillators that are alternatively activatable, the alternatively activatable oscillators having different energy consumptions and/or different noise properties, and at least one output interface for outputting a signal that is provided by the oscillator that is presently activated.

15 Claims, 2 Drawing Sheets

(58) Field of Classification Search
CPC ..... G01C 19/574; G01C 19/5776; H03L 7/08;
H03L 7/085; H03L 7/099
See application file for complete search history.

(56) References Cited

U.S. PATENT DOCUMENTS

| | | |
|---|---|---|
| 2003/0006854 A1* | 1/2003 | Ben-Ayun ................. H03J 5/24 |
| | | 331/175 |
| 2011/0121907 A1 | 5/2011 | Kanai et al. |
| 2015/0185011 A1 | 7/2015 | Beaulaton et al. |
| 2019/0277634 A1* | 9/2019 | Motiee ............... G01C 19/5712 |

* cited by examiner

PHASE-LOCKED LOOP FOR A DRIVER CIRCUIT FOR OPERATING A MEMS GYROSCOPE

FIELD

The present invention relates to a phase-locked loop for a driver circuit for operating a MEMS gyroscope.

The present invention further elates to a driver circuit for operating a MEMS gyroscope.

The present invention further relates to a method for phase control of a driver signal for operating a MEMS gyroscope.

BACKGROUND INFORMATION

Conventional MEMS gyroscope units, referred to below as "gyroscopes" for short, are often used together with an acceleration sensor in an inertial measuring unit, for example to enable applications using augmented reality, or navigation within buildings. In particular, the energy consumption for "Internet of things" applications or portable applications plays an important role in the end customer sector. A gyroscope that is in operation typically has high energy consumption. To reduce the energy consumption, the gyroscope is often switched off when it is not in use or when its measured data are not needed. However, this requires a long startup time in the case that the gyroscope is to once again deliver measured data, since its seismic mass must first be brought back into appropriate oscillation. To take this into account, conventional, the readout circuit is switched off when the gyroscope is not in use, but the driver circuit for the oscillation of the seismic mass is left activated.

A gyroscope system including a MEMS gyroscope that is connected to a driver system and a sensing system is descried in U.S. Pat. No. 9,506,757 B2. The driver system maintains the MEMS gyroscope in a state of oscillation, and maintains the sensing system in a state for receiving, amplifying, and demodulating an output signal of the MEMS gyroscope that indicates the rotation rate of the MEMS gyroscope. The gyroscope system additionally includes a phase-locked loop (PLL for short) that receives a reference clock signal (REFCLK) from the driver system and provides a system clock signal (CLK). The gyroscope system further includes a control device that is operated with the aid of the system clock signal, and that sets an operating state of the driver system and of the sensing system, and that likewise controls the operating state of the PLL. One or more system state parameters are maintained in an essentially unchangeable state during a so-called protection mode, which allows rapid transitions between a low-energy operating mode and a normal operating mode of the gyroscope system.

SUMMARY

In one specific example embodiment, the present invention provides a phase-locked loop for a driver circuit for operating a MEMS gyroscope, including a seismic mass that is excitable into oscillations, comprising an input interface for receiving position signals that represent the present position of the oscillating seismic mass of the MEMS gyroscope, a phase detector for ascertaining the phase and frequency of the present oscillation movement of the seismic mass, based on the received position signals, at least two oscillators that are alternatively activatable, the alternatively activatable oscillators having different energy consumptions and/or different noise properties, and at least one output interface for outputting a signal that is provided by the oscillator that is presently activated.

In a further specific example embodiment, the present invention provides a circuit arrangement for operating a MEMS gyroscope, including a seismic mass that is excitable into oscillations. The circuit arrangement includes a sensing unit that is connected to the MEMS gyroscope, and via which a useful signal of the MEMS gyroscope is providable. In addition, the circuit arrangement according to the present invention includes an amplitude control unit for outputting a control signal for exciting and maintaining a defined oscillation movement of the seismic mass of the MEMS gyroscope, based on position signals that represent the present position of the oscillating seismic mass of the MEMS gyroscope, and a phase-locked loop according to the present invention, at least one output interface of the phase-locked loop being connected to the amplitude control unit. Lastly, the circuit arrangement according to the present invention also includes an energy control unit that is connected to the sensing unit. One of multiple predefined operating modes of the MEMS gyroscope is specifiable with the aid of the energy control unit. In addition, the energy control unit is designed to activate one of the at least two oscillators and to deactivate the remaining oscillators as a function of the predefined operating mode.

In a further specific example embodiment, the present invention provides a MEMS gyroscope sensor system, including a MEMS gyroscope and a circuit arrangement according to the present invention, the MEMS gyroscope being connected on the one hand to an input interface of the sensing unit, and on the other hand to an input interface of the phase-locked loop and to an input interface and an output interface of the amplitude control device.

In a further specific example embodiment, the present invention provides a method for operating a MEMS gyroscope sensor system that includes a circuit arrangement according to the present invention, one of at least two predefined operating modes of the MEMS gyroscope sensor system being specified, and one of the at least two oscillators of the phase-locked loop being activated as a function of the predefined operating mode, while the remaining oscillators of the phase-locked loop are deactivated.

One of the advantages thus achieved is that the power consumption for the MEMS gyroscope circuit arrangement may be significantly lowered, while the oscillation movement of the seismic mass of the gyroscope is maintained regardless of its operating mode, so that a long startup time during changing of the operating state of the gyroscope does not have be waited for until reliable measured data of the gyroscope are available. The oscillator of the phase-locked loop of the drive circuit typically has comparatively high energy consumption compared to the other components of the MEMS gyroscope circuit arrangement, since the oscillator is also intended to provide a signal with low phase noise for demodulation of the sensing channel. This stringent requirement does not exist when the seismic mass of the gyroscope is merely to be kept in motion, but no measuring signal is detected and the sensing unit is switched off. The requirements for the quality of the oscillator may then be significantly reduced, and an oscillator with higher noise but with particularly low energy consumption may be used. In other words, via specific embodiments of the present invention, a phase-locked loop is provided that may be alternatively operated using at least two oscillators of different quality. One of the two oscillators is designed, for example, for operation with low noise in order to achieve a defined drive frequency for the seismic mass and enable reliable demodulation of the measuring signal, whereas the other oscillator is designed for low energy consumption in order to maintain a drive of the seismic mass of the MEMS gyroscope with low energy consumption when its sensing unit is switched off, i.e., no measured values of the gyroscope are detected.

Further features, advantages, and additional specific embodiments of the present invention are described below or are thus made apparent.

According to one advantageous refinement of the present invention, the phase-locked loop according to the present invention is equipped with a loop filter for applying at least one transfer function. This loop filter includes at least two outputs, each output of the loop filter being connected to one of the at least two oscillators, and an independent transfer function being associated with each output of the loop filter. The flexibility is thus increased, since different transfer functions may be provided by the loop filter at the same time.

According to a further advantageous refinement of the present invention, at least one of the at least two oscillators of the phase-locked loop according to the present invention has a voltage-controlled or current-controlled design. Simple control of at least one oscillator is thus made possible by use of electrical voltage signals or current signals.

According to a further advantageous refinement of the present invention, an energy control unit is provided which is designed to activate one of the at least two oscillators and to deactivate the remaining oscillators. The energy control unit is also connected to a switch element for actuation thereof. By appropriate activation and actuation of the switch element, in this specific embodiment of the present invention the respectively activated oscillator is incorporated into the signal path of the phase-locked loop, and the phase-locked loop is thus closed. In this specific embodiment of the present invention, the energy control unit does not just determine the operating mode of the phase-locked loop by activating one of the oscillators and deactivating the other oscillators. By use of the switch element, the energy control unit also incorporates the respectively activated oscillator into the phase-locked loop via circuitry.

According to a further advantageous refinement of the present invention, the activatable switch element includes a multiplexer. Simple implementation of a selection circuit is made possible with the aid of a multiplexer.

According to a further advantageous refinement of the present invention, at least one frequency divider is situated between the outputs of the at least two oscillators and the at least one output interface. The advantage is that the frequency of the signal at the output of the respective oscillator may be reduced in a certain whole-number division ratio.

According to a further advantageous refinement of the present invention, a separate frequency divider is associated with each oscillator. The advantage is increased flexibility, since due to the different frequencies of the different oscillators, it is likewise possible to use different frequency dividers. When the at least two oscillators have the same center frequency, it is also possible to merely use one shared frequency divider, which is then situated downstream from the selection circuit using signal technology.

According to one advantageous refinement of the circuit arrangement according to the present invention for operating a MEMS gyroscope, the energy control unit is designed to specify, as an operating mode of the MEMS gyroscope, either an active sensing operating mode in which sensor signals are detected and preprocessed, or at least one standby mode in which no sensor signals are detected and/or preprocessed, the oscillator of the at least two oscillators that has lower noise and/or is more frequency-stable being used for the active sensing operating mode, while the more energy-saving oscillator of the at least two oscillators is used for the at least one standby mode. In other words, one of the at least two oscillators is designed or operated to be particularly low in noise and/or frequency-stable, and the other of the at least two oscillators is designed to be particularly energy-saving.

An advantage is that the power consumption for the MEMS gyroscope circuit arrangement may be lowered considerably without reducing the accuracy of measured data of the MEMS gyroscope.

According to a further advantageous refinement of the circuit arrangement according to the present invention, a switch element is provided that is activatable by the energy control unit in such a way that the output signal of the respectively activated oscillator is supplied to the amplitude control unit, and the phase-locked loop is thus closed. This allows a simple central option for controlling the selection of the oscillator to be activated for closing the phase-locked loop.

According to one advantageous refinement of the method according to the present invention for operating a MEMS gyroscope sensor system, a switchover is made between an active sensing operating mode in which sensor signals are detected and preprocessed, and at least one standby mode in which no sensor signals are detected and/or preprocessed. For this purpose, for the active sensing operating mode the lower-noise and/or more frequency-stable oscillator of the at least two oscillators is activated or used, and for the at least one standby mode the more energy-saving oscillator of the at least two oscillators is activated or used, while the respective other oscillator is deactivated. The advantage is that the power consumption for the MEMS gyroscope circuit arrangement may be lowered considerably without performance losses during measuring operation, i.e., in the sensing operating mode.

According to a further advantageous refinement of the method, a switchover between the predefined operating modes of the MEMS gyroscope sensor system is individually initiated. This allows flexible switching over between the operating modes as needed.

According to a further advantageous refinement of the method, a switchover is automatically made between the predefined operating modes of the MEMS gyroscope sensor system with a specifiable frequency. Measured values of the MEMS gyroscope may thus be provided essentially continuously or at least regularly, at the same time with lower energy consumption.

It is understood that the features stated above and to be explained below may be used not only in the particular stated combination, but also in other combinations or alone without departing from the scope of the present invention.

Preferred embodiments and specific example embodiments of the present invention are illustrated in the figures and explained in greater detail in the following description; similar or functionally equivalent components or elements are denoted by the same reference numerals.

DETAILED DESCRIPTION OF EXAMPLE EMBODIMENTS

Figure 1:
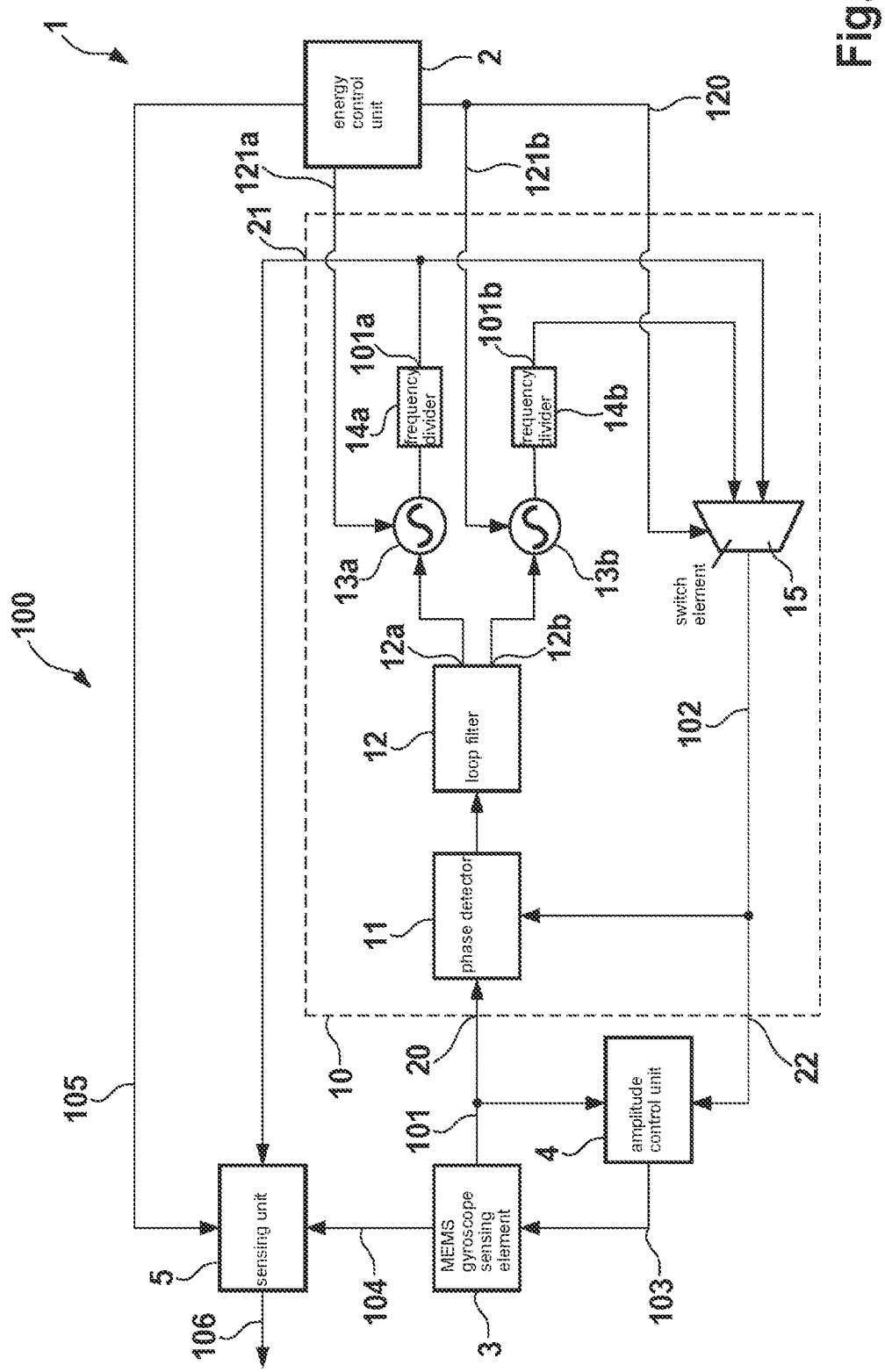
FIG. 1 shows the circuit diagram of a MEMS gyroscope sensor system according to one specific embodiment of the present invention.

FIG. 1 shows a MEMS gyroscope sensor system 1 in detail. MEMS gyroscope sensor system 1 includes a MEMS gyroscope sensor element 3 with a seismic mass that is excitable into oscillations, and a circuit arrangement 100 that includes a sensing unit 5, also referred to as a sensing front end 5, with a driver circuit and an energy control unit 2. The driver circuit, which is not separately denoted in FIG. 1, is made up here of an amplitude control unit 4 and a phase-locked loop 10. Phase-locked loop 10 includes an input interface 20 that is connected to MEMS gyroscope sensor element 3. Phase-locked loop 10 receives position signals 101, which represent the particular present position of the oscillating seismic mass of MEMS gyroscope 3, via this input interface 20. These position signals 101 are supplied to a phase detector 11 of phase-locked loop 10, which is connected to a loop filter 12 via further signal technology. Loop filter 12 includes two outputs 12a, 12b that are connected to an oscillator 13a, 13b, respectively. According to the present invention, the two oscillators 13a, 13b differ in their energy consumption and/or in their noise properties. Thus, oscillator 13a may have a higher, in particular much higher, quality than oscillator 13b, which in turn may have lower, in particular much lower, energy consumption than oscillator 13a, as explained in greater detail below. Oscillators 13a, 13b are further connected to a frequency divider 14a, 14b, respectively. The output signals 101a, 101b respectively provided by the two frequency dividers 14a, 14b are supplied to a switch element 15 in the form of a multiplexer, which provides either signal 101a or signal 101b of respective oscillator 13a, 13b as signal 102 to amplitude control unit 4 via an output interface 22. Energy control unit 2 is connected both to sensing unit 5 and to the two oscillators 13a, 13b and to switch element 15. Energy control unit 2 specifies the operating mode of MEMS gyroscope sensor system 1. The energy control unit may select between a sensing operating mode in which sensor signals are detected and preprocessed, and a standby mode in which no sensor signals are detected and/or preprocessed. For selecting the sensing operating mode, energy control unit 2 activates sensing unit 5 via signal path 105, and activates lower-noise oscillator 13a via signal path 121a. The more energy-saving oscillator 13b is deactivated via signal path 121b. In addition, energy control unit 2 activates switch element 15 via signal path 120 in such a way that oscillator 13a is switched into phase-locked loop 10, and phase-locked loop 10 is thus closed by lower-noise oscillator 13a. For switching over into the standby operating mode, energy control unit 2 deactivates sensing unit 5 via signal path 105. Lower-noise oscillator 13a is likewise deactivated via signal path 121a. Instead, the more energy-saving oscillator 13b is now activated via signal path 121b. In addition, energy control unit 2 activates switch element 15 via signal path 120 in such a way that oscillator 13b is now switched into phase-locked loop 10, and phase-locked loop 10 is thus closed by the more energy-saving oscillator 13b. Accordingly, the two oscillators 13a, 13b are thus also switched on or off via corresponding control signals 121a, 121b of energy control unit 2 as a function of the selected operating mode of MEMS gyroscope sensor system 1.

The position signals 101 are also supplied to amplitude control unit 4. The amplitude control unit generates a driver signal 103 for MEMS gyroscope sensor element 3, based on position signals 101 and output signal 102 of phase-locked loop 10. This driver signal 103 is generated regardless of the operating mode of MEMS gyroscope sensor system 1, and is used to maintain the oscillation movement of the seismic mass of MEMS gyroscope sensor element 3, regardless of the operating mode of MEMS gyroscope sensor system 1.

In the sensing operating mode, measuring signals 104 detected by MEMS gyroscope sensor element 3 are read out by activated sensing unit 5 and demodulated with the aid of output signal 101a of lower-noise oscillator 13a in order to provide a rotation rate sensor signal as a useful signal 106.

Phase-locked loop 10 is a closed system that ascertains the phase and frequency of an input signal, in the present case a position data signal of MEMS gyroscope 3. As discussed above, phase-locked loop 10 here includes a phase detector 11, a loop filter 12, and two controllable oscillators 13a, 13b, in particular in the form of voltage-controlled oscillators (VCOs), and a downstream frequency divider 14a, 14b, respectively, having the respective factors 1/N1 and 1/N2. In the present case in FIG. 1, loop filter 12 includes two output interfaces 12a, 12b that may apply and provide various transfer functions to the respective input signal. Each of the signals to which the particular transfer function has been applied is then respectively provided to one of the two oscillators 13a, 13b. One of oscillators 13a is designed to provide low (phase) noise, which requires a correspondingly high frequency, and thus high energy consumption. In contrast, the other oscillator 13b is designed for particularly low energy consumption, optionally with a lower frequency than first oscillator 13a, and with greater noise.

Due to the oscillation frequencies of oscillators 13a, 13b which are possibly different, it is likewise possible, as in FIG. 1, to use two different frequency dividers 14a, 14b having different coefficients 1/N1 or 1/N2, respectively. If the two oscillators 13a, 13b have the same center frequency, phase-locked loop 10 or MEMS gyroscope circuit arrangement 1 as a whole may be operated using a single divided frequency divider. This frequency divider is then situated downstream from switch element 15, using signal technology. Switch element 15 is controlled outside phase-locked loop 10 by energy control unit 2. Energy control unit 2 then selects which of the two oscillators 13a, 13b provides the signal for the control loop to be closed. In particular, only one oscillator 13a, 13b is activated in each case. The signal path of the oscillator having lower noise (oscillator 13a in FIG. 1) is connected to sensing front end 5, which reads out the rotational speed of MEMS gyroscope 3 and which requires a corresponding demodulation signal 105 from phase-locked loop 10. Amplitude control unit 4 instead reads out the position of MEMS gyroscope sensor element 3 and provides a driver signal 103 in order to keep the amplitude of MEMS gyroscope sensor element 3 constant. For this purpose, amplitude control unit 4 likewise requires a driver signal 102 from phase-locked loop 10 in order to detect the amplitude movement and to provide a suitable driver signal 103 at the resonant frequency of MEMS gyroscope sensor element 3. The operating mode of MEMS gyroscope sensor system 1 is specified with the aid of energy control unit 2. If sensing front end 5 is switched on, oscillator 13a of phase-locked loop 10 that is designed for lower noise is used. If sensing front end 5 is switched off, a switchover is made to second oscillator 13b having lower energy consumption. The respective oscillator 13a, 13b that is not used is then switched off to save energy.

Figure 2:
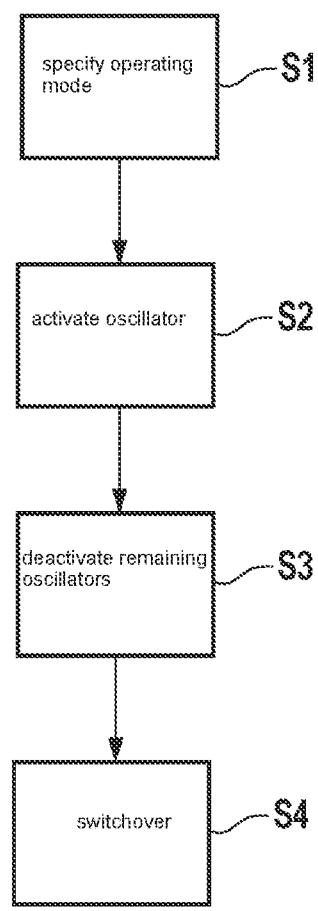
FIG. 2 shows steps of a method for operating a MEMS gyroscope sensor system according to one specific embodiment of the present invention.

The method according to the present invention for operating a MEMS gyroscope sensor system 1, as illustrated in FIG. 1, is explained below with reference to FIG. 2.

The method includes the following steps.

One of at least two predefined operating modes of MEMS gyroscope sensor system 1 is specified in a first step S1.

One of the at least two oscillators of the phase-locked loop is activated in a further step S2 as a function of the predefined operating mode.

The remaining oscillators of the phase-locked loop are deactivated in a further step S3.

In a further optional step S4, a switchover between the predefined operating modes of MEMS gyroscope sensor system 1 is individually initiated, and/or the switchover between the predefined operating modes of the MEMS gyroscope sensor system takes place automatically with a specifiable frequency.

What is claimed is:

1. A phase-locked loop for a driver circuit for operating a MEMS gyroscope, including a seismic mass that is excitable into oscillations, comprising:
    an input interface configured to receive position signals that represent a present position of the oscillating seismic mass of the MEMS gyroscope;
    a phase detector configured to ascertain a phase and a frequency of a present oscillation movement of the seismic mass, based on the received position signals;
    at least two oscillators that are alternatively activatable, the alternatively activatable oscillators having different energy consumptions and/or different noise properties; and
    at least one output interface configured to output a signal that is provided by the oscillator that is presently activated.

2. The phase-locked loop as recited in claim 1, further comprising:
    a loop filter configured to apply at least one transfer function, the loop filter including at least two outputs, each output of the outputs of the loop filter being connected to one of the at least two oscillators, and an independent transfer function being associated with each output of the outputs of the loop filter.

3. The phase-locked loop as recited in claim 1, wherein at least one of the at least two oscillators has a voltage-controlled or current-controlled design.

4. The phase-locked loop as recited in claim 1, wherein an energy control unit is provided which is configured to activate one of the at least two oscillators and to deactivate the remaining oscillators of the at least two oscillators, and to activate a switch element, so that by actuating the switch element, the activated oscillator is incorporated into a signal path of the phase-locked loop, and the phase-locked loop is thus closed.

5. The phase-locked loop as recited in claim 4, wherein the activatable switch element includes a multiplexer.

6. The phase-locked loop as recited in claim 1, wherein at least one frequency divider is situated between outputs of the at least two oscillators and the at least one output interface.

7. The phase-locked loop as recited in claim 6, further comprising a separate frequency divider associated with each of the oscillators.

8. A circuit arrangement for operating a MEMS gyroscope that includes a seismic mass that is excitable into oscillations, comprising:
    a sensing unit that is connected to the MEMS gyroscope, and via which a useful signal of the MEMS gyroscope is providable;
    an amplitude control unit configured to output a control signal for exciting and maintaining a defined oscillation movement of the seismic mass of the MEMS gyroscope, based on position signals that represent a present position of the oscillating seismic mass of the MEMS gyroscope;
    a phase-locked loop including:
        an input interface configured to receive position signals that represent a present position of the oscillating seismic mass of the MEMS gyroscope,
        a phase detector configured to ascertain a phase and a frequency of a present oscillation movement of the seismic mass, based on the received position signals,
        at least two oscillators that are alternatively activatable, the alternatively activatable oscillators having different energy consumptions and/or different noise properties, and
        at least one output interface configured to output a signal that is provided by the oscillator that is presently activated, the at least one output interface of the phase-locked loop being connected to the amplitude control unit; and
    an energy control unit connected to the sensing unit, one of multiple predefined operating modes of the MEMS gyroscope being specifiable using the energy control unit, and the energy control unit being configured to activate one of the at least two oscillators and to deactivate the remaining oscillators of the at least two oscillators as a function of the predefined operating mode.

9. The circuit arrangement as recited in claim 8, wherein the energy control unit is configured to specify, as an operating mode of the MEMS gyroscope, either an active sensing operating mode in which sensor signals are detected and preprocessed, or at least one standby mode in which no sensor signals are detected and/or preprocessed, that oscillator of the at least two oscillators that has lower noise and/or is more frequency-stable being used for the active sensing operating mode, while a more energy-saving oscillator of the at least two oscillators is used for the at least one standby mode.

10. The circuit arrangement as recited in claim 8, further comprising:
    a switch element activatable by the energy control unit in such a way that an output signal of the activated oscillator is supplied to the amplitude control unit, and the phase-locked loop is thus closed.

11. A MEMS gyroscope sensor system, comprising:
    a MEMS gyroscope that includes a seismic mass that is excitable into oscillations; and
    a circuit arrangement including:
        a sensing unit that is connected to the MEMS gyroscope, and via which a useful signal of the MEMS gyroscope is providable;
        an amplitude control unit configured to output a control signal for exciting and maintaining a defined oscillation movement of the seismic mass of the MEMS gyroscope, based on position signals that represent a present position of the oscillating seismic mass of the MEMS gyroscope;
        a phase-locked loop including:
            an input interface configured to receive position signals that represent a present position of the oscillating seismic mass of the MEMS gyroscope, a phase detector configured to ascertain a phase and a frequency of a present oscillation movement of the seismic mass, based on the received position signals, at least two oscillators that are alternatively activatable, the alternatively activatable oscillators having different energy consumptions and/or different noise properties, and at least one output interface configured to output a signal that is provided by the oscillator that is presently activated, the at least one output interface of the phase-locked loop being connected to the amplitude control unit; and an energy control unit connected to the sensing unit, one of multiple predefined operating modes of the MEMS gyroscope being specifiable using the energy control unit, and the energy control unit being configured to activate one of the at least two oscillators and to deactivate the remaining oscillators of the at least two oscillators as a function of the predefined operating mode;

wherein the MEMS gyroscope is connected on the one hand to an input interface of the sensing unit, and on the other hand to an input interface of the phase-locked loop and to an input interface and an output interface of the amplitude control device.

12. A method for operating a MEMS gyroscope sensor system, including a circuit arrangement for operating a MEMS gyroscope that includes a seismic mass that is excitable into oscillations, the circuit arrangement including:

a sensing unit that is connected to the MEMS gyroscope, and via which a useful signal of the MEMS gyroscope is providable;

an amplitude control unit configured to output a control signal for exciting and maintaining a defined oscillation movement of the seismic mass of the MEMS gyroscope, based on position signals that represent a present position of the oscillating seismic mass of the MEMS gyroscope;

a phase-locked loop including:
an input interface configured to receive position signals that represent a present position of the oscillating seismic mass of the MEMS gyroscope, a phase detector configured to ascertain a phase and a frequency of a present oscillation movement of the seismic mass, based on the received position signals, at least two oscillators that are alternatively activatable, the alternatively activatable oscillators having different energy consumptions and/or different noise properties, and at least one output interface configured to output a signal that is provided by the oscillator that is presently activated, the at least one output interface of the phase-locked loop being connected to the amplitude control unit; and an energy control unit connected to the sensing unit, one of multiple predefined operating modes of the MEMS gyroscope being specifiable using the energy control unit, and the energy control unit being configured to activate one of the at least two oscillators and to deactivate the remaining oscillators of the at least two oscillators as a function of the predefined operating mode, the method comprising:
specifying one of at least two predefined operating modes of the MEMS gyroscope sensor system;

activating one of the at least two oscillators of the phase-locked loop as a function of the predefined operating mode, while the remaining oscillators of the at least two oscillators of the phase-locked loop are deactivated.

13. The method as recited in claim 12, wherein a switchover is made between an active sensing operating mode in which sensor signals are detected and preprocessed, and at least one standby mode in which no sensor signals are detected and/or preprocessed, a lower-noise and/or more frequency-stable oscillator of the at least two oscillators being used for the active sensing operating mode, while a more energy-saving oscillator of the at least two oscillators is used for the at least one standby mode.

14. The method as recited in claim 12, wherein a switchover between the predefined operating modes of the MEMS gyroscope sensor system is individually initiated.

15. The method as recited in claim 12, wherein a switchover between the predefined operating modes of the MEMS gyroscope sensor system is automatically initiated with a specifiable frequency.

* * * * *